United States Patent
Lorenz et al.

(10) Patent No.: US 8,666,533 B2
(45) Date of Patent: Mar. 4, 2014

(54) SYSTEM, METHOD, AND INTERFACE FOR VIRTUAL COMMISSIONING OF PRESS LINES

(75) Inventors: Ulrich Wolfgang Lorenz, Berlin (DE); Peter Heinrich Armbrust, Berlin (DE)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 833 days.

(21) Appl. No.: 12/752,745

(22) Filed: Apr. 1, 2010

(65) Prior Publication Data

US 2011/0087357 A1    Apr. 14, 2011

Related U.S. Application Data

(60) Provisional application No. 61/237,919, filed on Oct. 9, 2009.

(51) Int. Cl.
*G06F 19/00*    (2011.01)

(52) U.S. Cl.
USPC ........... 700/182; 700/173; 700/183; 700/184; 700/187; 700/192

(58) Field of Classification Search
USPC ........... 700/29, 169, 173, 186, 189, 182–184, 700/187, 192
See application file for complete search history.

(56) References Cited

U.S. PATENT DOCUMENTS

| | | | |
|---|---|---|---|
| 5,067,085 A * | 11/1991 | Wenzel et al. | 700/164 |
| 5,210,478 A * | 5/1993 | Sasaki et al. | 318/632 |
| 5,495,410 A * | 2/1996 | Graf | 700/86 |
| 5,617,321 A | 4/1997 | Frizelle et al. | |
| 6,292,715 B1 * | 9/2001 | Rongo | 700/249 |
| 6,445,964 B1 * | 9/2002 | White et al. | 700/61 |
| 6,606,528 B1 * | 8/2003 | Hagmeier et al. | 700/98 |
| 6,802,045 B1 | 10/2004 | Sonderman et al. | |
| 7,076,322 B2 * | 7/2006 | Chandhoke | 700/181 |
| 7,174,225 B2 * | 2/2007 | Dolansky | 700/26 |
| 7,174,284 B2 * | 2/2007 | Dolansky et al. | 703/2 |
| 7,219,041 B2 * | 5/2007 | Hamann | 703/6 |
| 7,331,244 B1 | 2/2008 | Little et al. | |
| 7,636,612 B2 * | 12/2009 | Weber et al. | 700/173 |
| 7,873,431 B2 | 1/2011 | Takahashi et al. | |
| 7,902,785 B2 * | 3/2011 | Denk et al. | 318/573 |
| 8,175,861 B2 * | 5/2012 | Huang et al. | 703/13 |
| 2006/0058906 A1 * | 3/2006 | Ohashi et al. | 700/182 |
| 2007/0050091 A1 * | 3/2007 | Nagatsuka et al. | 700/259 |
| 2007/0061037 A1 * | 3/2007 | Grossmann et al. | 700/182 |
| 2007/0213874 A1 * | 9/2007 | Oumi et al. | 700/245 |
| 2007/0248937 A1 | 10/2007 | Chen | |
| 2008/0091394 A1 * | 4/2008 | Hahn et al. | 703/7 |
| 2008/0215164 A1 * | 9/2008 | Denk et al. | 700/29 |
| 2009/0299509 A1 * | 12/2009 | Diezel et al. | 700/97 |
| 2009/0326891 A1 | 12/2009 | Onishi et al. | |
| 2011/0106308 A1 * | 5/2011 | Eliasson | 700/250 |
| 2012/0215352 A1 * | 8/2012 | Eberst | 700/253 |

* cited by examiner

*Primary Examiner* — Ronald Hartman, Jr.

(57) ABSTRACT

A system, method, machine-readable medium for accurate simulation of automated machinery. A method includes loading a machine operating model. The method also includes receiving machine-specific data from an automated machinery controller. The method also includes simulating a machine operation using the machine-specific data and the machine operating model to produce optimized motion data. The method includes transmitting the optimized data to the automated machinery controller by the simulation data processing system.

18 Claims, 3 Drawing Sheets

SYSTEM, METHOD, AND INTERFACE FOR VIRTUAL COMMISSIONING OF PRESS LINES

CROSS-REFERENCE TO RELATED APPLICATION

This application claims priority to U.S. Provisional Patent Application 61/237,919, filed Aug. 28, 2009, which is hereby incorporated by reference.

TECHNICAL FIELD

The present disclosure is directed, in general, to systems and methods for use in computer-aided design, manufacturing, engineering, modeling, and visualization (individually and collectively, "CAD" and "CAD systems") and in product lifecycle management ("PLM") systems.

BACKGROUND OF THE DISCLOSURE

Many manufactured products are first designed and modeled in CAD systems, and PLM systems are used by manufacturers, retailers, customers, and other users to manage the design, use, and disposal of various products. Automated machinery such as press lines are used to manufacture physical parts. Improved systems are desirable.

SUMMARY OF THE DISCLOSURE

Various embodiments include a system, method, machine-readable medium for accurate simulation of automated machinery. A method includes loading a machine operating model. The method also includes receiving machine-specific data from an automated machinery controller. The method also includes simulating a machine operation using the machine-specific data and the machine operating model to produce optimized motion data. The method includes transmitting the optimized data to the automated machinery controller by the simulation data processing system.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
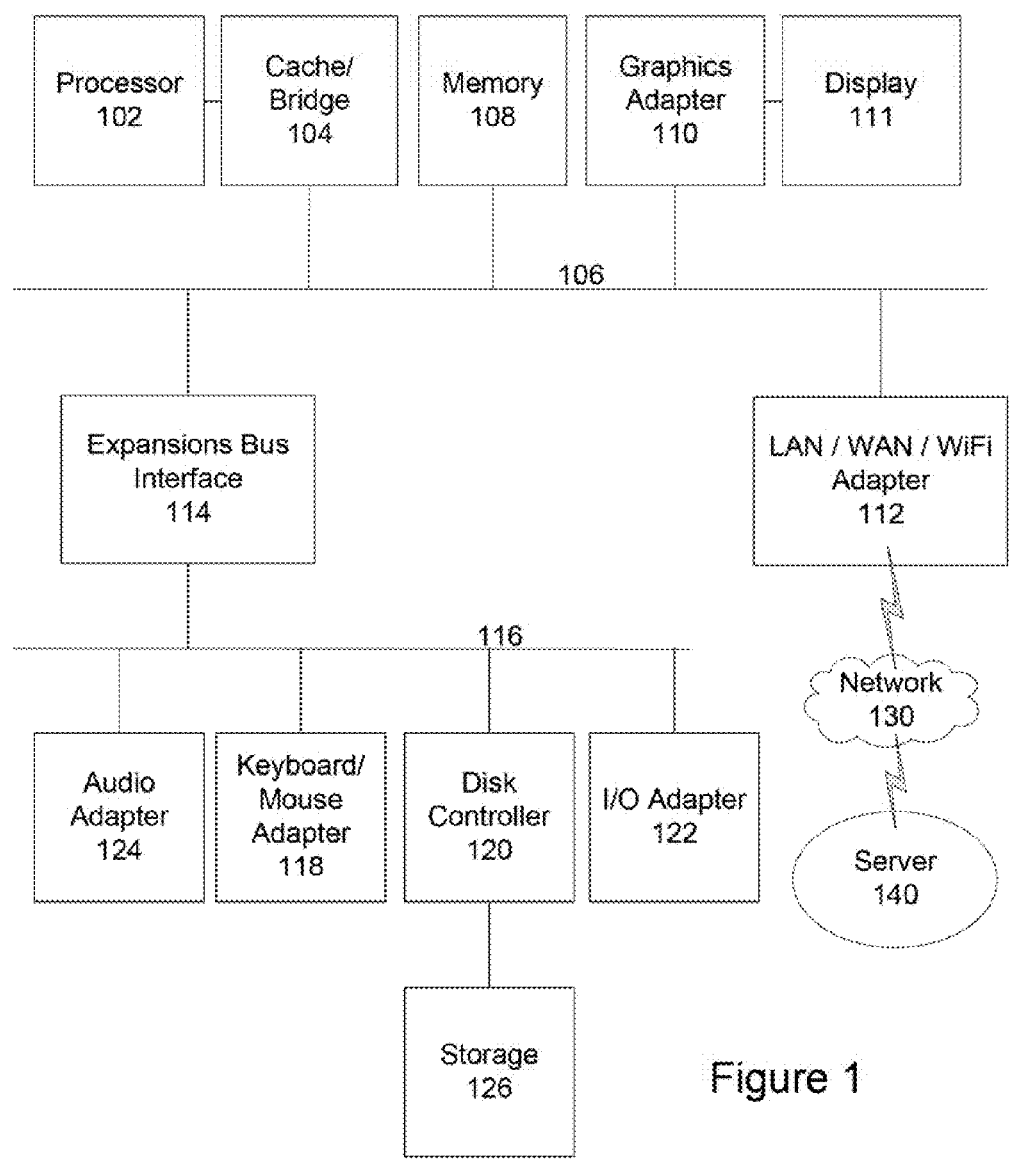
FIG. 1 depicts a block diagram of a data processing system in which an embodiment can be implemented.
Figure 2:
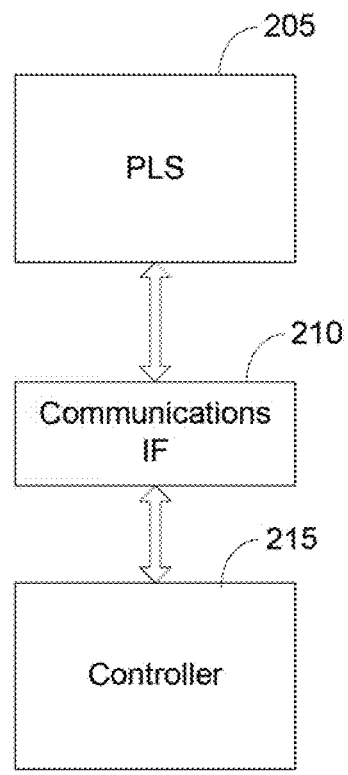
FIG. 2 depicts a block diagram of a simulation system in accordance with disclosed embodiments.
Figure 3:
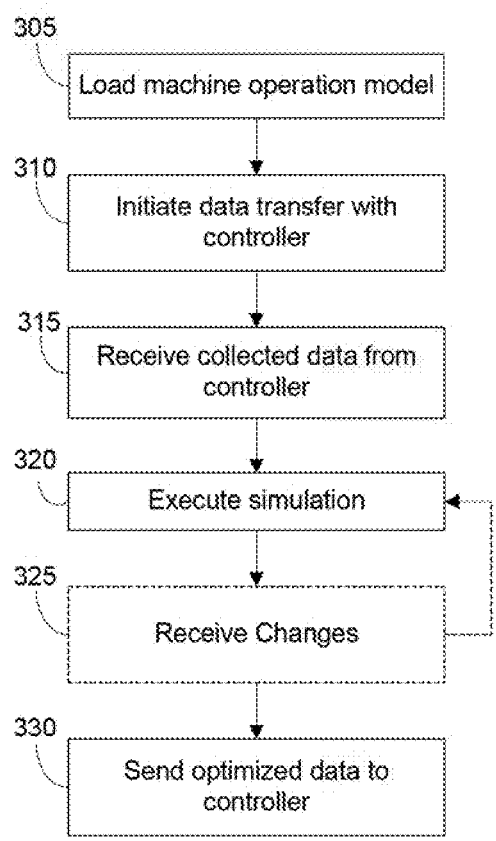
FIG. 3 depicts a flowchart of a process in accordance with disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

A press line is an automated manufacturing device used for pressing or stamping parts into specific shapes, such as pressing sheet metal into a car part. Virtual commissioning of press lines involves replicating the behavior of one or more pieces of press line hardware with a software environment. Disclosed embodiments provide an environment for validating all controller settings prior to setup and configuration of the real press line. Disclosed embodiments help improve quality and enable a seamless transition from the virtual to physical machine environment during setup. While the specific embodiments described below relate to press lines, those of skill in the art will recognize that the processes and techniques described herein also apply to other automated systems.

The stamping process plays a key role in the manufacturing process since it is the origin in the production chain in many cases. In the automotive industry in particular, stamping car parts is done using fully automated large transfer press lines. Areas which are of special interest for time and cost savings include commissioning of the press line and setup after installation of a new die set.

Commissioning of a transfer press line is a process which can take some weeks. This time frame is needed for verification of the controller curves for the different press modes (startup, normal operation, and shutdown) and curve sets. Typically the commissioning phase can begin only after the press is completely built up. If an error occurs in this phase, repair is often difficult, time-intensive and delays the start of productive operation.

For every new die set a full press setup has to be done which is lost time since the press cannot be used for production. Taking into account that automotive OEMs offer a large number of new car types every year, reducing the setup time of the transfer presses becomes a major goal for production system optimization. The disclosed systems and methods provide for a virtual setup and commissioning to validate configuration before physically commissioning the equipment.

FIG. 1 depicts a block diagram of a data processing system in which an embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106.

Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition to or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments include a system for virtual commissioning and virtual setup of transfer presses. In some embodiments, the system includes Siemens SIMOTION® hardware controllers used in the press line (although of course other hardware controllers can be used in other embodiments) and a computer-implemented process for simulation of the press and verification of the controllers and other process parameters.

Some embodiments use an alternative to the hardware controllers by integrating of virtual hardware controllers based on PC platforms. In addition to the interaction with the simulation software the operation results of the virtual controller can be used for dimensioning the real controller.

In current production process environments, time plays the major role because it is one of the most important factors for productivity and product output. For the stamping process this means that the presses should ideally run all the time at the topmost stroke rate. Because of the large investment costs, the operational costs of large press lines can be as much as thousands of dollars per hour.

For these reasons and others, press line standstill times should be avoided. Press line standstill generally cannot be avoided when the press is commissioned for the first time, when major kinematics changes occur during press lifetime, and after scheduled maintenance. For all these areas, system errors can be detected only at a late stage. As a result, a considerable amount of time is spent for setting up the press for the new operational regime.

Disclosed embodiments include systems and methods for simulating the press line behavior including the real controller hardware before applying the settings to the real press. This will be beneficial for many classes of users. For example, press manufacturers can simulate and test the virtual press before it is physically assembled at the shop floor, and controller and design errors can be detected at an early stage. End users of the press line can simulate a press line configuration before any major change in the press controller scheme takes place and the results can be directly transferred to the real press.

A virtual commissioning system for press lines in accordance with disclosed embodiments can use SIMOTION control units or other conventional hardware controllers, a press line simulation software and system (PLS) as described herein, and the communication interface between the two components.

FIG. 2 depicts a block diagram of a simulation system in accordance with disclosed embodiments. Shown here is a PLS simulation system 205, which can be implemented, for example, as a data processing system 100. PLS 205 communicates over communications interface 210 with controller 215. Communications interface 210 can be different types of data communication based on the TCP/IP protocol, including wireless, wired, over a private communications network, over a public communications network such as the Internet, or otherwise. Controller 215 can be any hardware controller with a suitable communication protocol interface, and is preferably a manufacturing hardware controller for automated machinery, and can specifically be a Siemens SIMOTION® hardware controller used in a manufacturing press line.

In an example implementation, as a point of origin, the controller 215 can store the data for a project with the main characteristics of the press's motor drives, the motion curves of the press, and all kinematics information necessary to drive the press line, and other data known to those of skill in the art.

The curves are derived from the characteristic curves of the machine which was selected during the dimensioning process. Other press-relevant information is calculated from the sources given by the press manufacturer.

FIG. 2 can be used to describe the interaction between the controller 215 and

PLS 205 in accordance with disclosed embodiments. PLS 205 is a full featured offline programming system and simulation system for the manufacturing press line. PLS 205 includes a virtual press model of the dedicated press where all geometric and kinematics data is taken from the real press, or from the documentation of the press manufacturer. Through the use of the real press curves and the real controller 215 a maximum accuracy is achieved so that all results are directly applicable to the press.

PLS 205 can request and receive motion data from the controller 215. PLS 205 performs the simulation and verification functions described herein, and sends the verified motion data back to controller 215.

FIG. 3 depicts a flowchart of a process in accordance with disclosed embodiments. According to various embodiments, the virtual commissioning process can perform steps as described below. In the process below, "system" refers to the PLS simulation data processing system, such as PLS 205, or another automated machinery simulation data processing system.

The system loads a machine operation model (step 305), such as a virtual press model. This model can include all kinematics axes as well as motion curves for the initial phase but, generally, will not include any motion curves which have their origin in the controller. Of course, in implementations using other automated machinery, the machine operation model is replaced with other numerically controller machine (NCM) data, and can omit any machine-specific data that has its origin in the specific NCM controller being operated.

The system initiates the data transfer from the controller to the system to receive the machine-specific data (step 310). For example, in some implementations, the system can execute a Trace function in the controller to collect the content of predefined variables during one full cycle (360°) of the press and any other normalized data or machine-specific data.

The system receives the collected machine-specific data from the controller (step 315). The system polls the controller for the data, and in some embodiments, this data can be sent from the controller and received by the system automatically. In some embodiments, the controller sends a signal to the system including the collected data. This step can include the system performing any necessary interpretation of the received collected data so that it can be used by the system. The collected data can include all kinematics data and other parameters that are normally stored locally in the controller itself, including the real motion curves of the press line or other automated machinery.

The system executes a simulation of the controller and machine using the collected data (step 320). Based on the simulation results, the motion data can be verified and optionally changed, typically by the user. The system stores the optimized motion data and other settings in accordance with the simulation. By using the collected data, the system can accurately represent the actual motions and characteristics of the controller and the automated machinery. The simulation can be used for visualization, verification, optimization, and programming, as well as other purposes.

In some cases, the initial motion curves do not provide an optimum function of the press during the startup and normal operation phase. In this case, and in other cases where the initial data does not provide an optimum solution, the system can optionally receive changes such as adjustments and modified programming settings (step 325), from a user, another system, storage, or otherwise. After each change or set of changes, the system repeats the simulation (returning to step 320).

When the process is complete, after successful simulation (including any optional changes and re-simulations) the system sends the optimized motion data and other settings to the hardware controller to be stored so that the operation of the press is now optimized (step 330). If necessary, more than one loop might be executed for a final optimization. The optimized motion data can include motion data for multiple modes of operation of the automated machinery, for example, including motion data for startup, normal operation, and shutdown modes of a press line. The press line or other automated machinery can then be operated using the optimized motion data and other settings, providing a distinct technical advantage over known systems.

In some embodiments, both the controller software and PLS can use C++ code for the computationally intensive operations. The interface between the two sides can be realized using the SOAP or other suitable protocol over the communications interface with the hardware controller as the server and PLS as the client.

Some embodiments include the integration of virtual hardware controllers based on PC platforms. In addition to the interaction with the simulation software, the operation results of the virtual controller can be used for dimensioning the real controller. A virtual hardware controller can be implemented as a virtual machine on a PC and maps all relevant data of the real hardware controller. With the virtual hardware controller it is possible to provide virtual commissioning of a press line without any piece of automated machinery hardware.

Various embodiments can be particularly useful for worldwide manufacturers of large scale press lines which have a large potential for cost savings. Other embodiments can be useful at the end users site (existing press lines) for an optimization of the press behavior when changes of the control scheme have been applied.

Those skilled in the art will recognize that, for simplicity and clarity, the full structure and operation of all data processing systems suitable for use with the present disclosure are not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for accurate simulation of automated machinery, comprising:
   loading a machine operating model in a simulation data processing system;
   receiving machine-specific data from an automated machinery controller by the simulation data processing system;
   simulating a machine operation, by the simulation data processing system, using the machine-specific data and the machine operating model to produce optimized motion data, wherein the optimized data includes motion data for multiple modes of operation of the automated machinery, the modes including at least startup, normal operation, and shutdown modes; and
   transmitting the optimized data to the automated machinery controller by the simulation data processing system.

2. The method of claim 1, wherein the machine-specific data includes real motion curve data.

3. The method of claim 1, wherein the automated machinery controller is a press line controller.

4. The method of claim 1, wherein the machine-specific data includes kinematics data stored in the machine controller.

5. The method of claim 1, further comprising receiving changes to the machine-specific data and simulating the machine operation using the changed machine-specific data.

6. The method of claim 1, further comprising interpreting the received machine-specific data.

7. An automated machinery simulation data processing system, comprising a processor and accessible memory, and configured to perform the steps of:
   loading a machine operating model;
   receiving machine-specific data from an automated machinery controller;
   simulating a machine operation using the machine-specific data and the machine operating model to produce optimized motion data, wherein the optimized data includes motion data for multiple modes of operation of the automated machinery, the modes including at least startup, normal operation, and shutdown modes; and
   transmitting the optimized data to the automated machinery controller.

8. The automated machinery simulation data processing system of claim 7, wherein the machine-specific data includes real motion curve data.

9. The automated machinery simulation data processing system of claim 7, wherein the automated machinery controller is a press line controller.

10. The automated machinery simulation data processing system of claim 7, wherein the machine-specific data includes kinematics data stored in the machine controller.

11. The automated machinery simulation data processing system of claim 7, further configured to perform the stop of receiving changes to the machine-specific data and simulating the machine operation using the changed machine-specific data.

12. The automated machinery simulation data processing system of claim 7, configured to perform the stop of comprising interpreting the received machine-specific data.

13. A non-transitory machine-readable medium storing machine-executable instructions that, when executed, cause a system to perform the steps of:
   loading a machine operating model;
   receiving machine-specific data from an automated machinery controller;
   simulating a machine operation using the machine-specific data and the machine operating model to produce optimized motion data, wherein the optimized data includes motion data for multiple modes of operation of the automated machinery, the modes including at least startup, normal operation, and shutdown modes; and
   transmitting the optimized data to the automated machinery controller.

14. The machine-readable medium of claim 13, wherein the machine-specific data includes real motion curve data.

15. The machine-readable medium of claim 13, wherein the automated machinery controller is a press line controller.

16. The machine-readable medium of claim 13, wherein the machine-specific data includes kinematics data stored in the machine controller.

17. The machine-readable medium of claim 13, further storing instructions causing the system to perform the step of receiving changes to the machine-specific data and simulating the machine operation using the changed machine-specific data.

18. The machine-readable medium of claim 13, further storing instructions causing the system to perform the step of interpreting the received machine-specific data.

* * * * *